United States Patent
Hong

(10) Patent No.: US 6,232,202 B1
(45) Date of Patent: *May 15, 2001

(54) METHOD FOR MANUFACTURING SHALLOW TRENCH ISOLATION STRUCTURE INCLUDING A DUAL TRENCH

(75) Inventor: Gary Hong, Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,231

(22) Filed: Apr. 5, 1999

(30) Foreign Application Priority Data

Nov. 6, 1998 (TW) .................................................. 87118502

(51) Int. Cl.[7] .......................... H01L 21/76; H01L 21/311; H01L 21/302
(52) U.S. Cl. .......................... 438/424; 438/435; 438/700; 438/704
(58) Field of Search .................................. 438/424, 700, 438/435, 437, 704

(56) References Cited

U.S. PATENT DOCUMENTS

| | | | |
|---|---|---|---|
| 5,103,276 | * | 4/1992 | Shen et al. . |
| 5,112,771 | * | 5/1992 | Ishii et al. . |
| 5,629,226 | * | 5/1997 | Ohtsuki . |
| 5,910,018 | * | 6/1999 | Jang . |
| 6,008,131 | * | 12/1999 | Chen . |

* cited by examiner

Primary Examiner—John F. Niebling
Assistant Examiner—Ron Pompey
(74) Attorney, Agent, or Firm—Jiawei Huang; J. C. Patents

(57) ABSTRACT

A method for manufacturing a shallow trench isolation structure. A two-stage process is performed to form a trench. An anisotropic etching operation is conducted to form a smaller trench, and then an isotropic etching operation is conducted to form a wider trench underneath. Hence, a portion of trench extends into the substrate below the device-forming regions. An insulating material is deposited to fill the trench. Therefore, the degree of electrical insulation between devices in neighboring active regions is increased without affecting the layout of device on the substrate. Moreover, the degree of overlap between the source/drain region and the substrate is reduced. Hence, junction capacitance is lowered and operating speed of the device is increased.

10 Claims, 4 Drawing Sheets

METHOD FOR MANUFACTURING SHALLOW TRENCH ISOLATION STRUCTURE INCLUDING A DUAL TRENCH

CROSS-REFERENCE TO RELATED APPLICATION

This application claims the priority benefit of Taiwan application serial no. 87118502, filed Nov. 6, 1998, the full disclosure of which is incorporated herein by reference.

BACKGROUND OF THE INVENTION

1. Field of Invention

The present invention relates to a method for manufacturing shallow trench isolation (STI) structure. More particularly, the present invention relates to a method for manufacturing an STI structure with a reduced junction capacitance between source/drain region and substrate.

2. Description of Related Art

A device isolation region is a structure within the substrate that prevents the movement of carriers from one device to its neighbors. For example, device isolation regions are normally formed between metallic oxide semiconductor (MOS) transistors for reducing charge leakage. As the level of integration increases and line width of the device decreases to the sub-quarter micron (0.25 $\mu$m) range, STI is one of the principle means for isolating devices. An STI structure is formed by first performing an anisotropic etching operation to etch out a trench in a semiconductor substrate, and then refilling the trench with insulating material.

FIGS. 1A through 1F are schematic, cross-sectional views showing the progression of manufacturing steps according to a conventional method of forming a shallow trench isolation structure.

First, as shown in FIG. 1A, a pad oxide layer 102 is formed over a silicon substrate 100. The pad oxide layer 102 will be removed before the gate oxide layer is formed. Thereafter, a silicon nitride ($Si_3N_4$) layer 104 is formed over the pad oxide layer 102 by performing a low-pressure chemical vapor deposition (LPCVD) operation.

Next, as shown in FIG. 1B, conventional method is used to form a patterned photoresist layer (not shown in the figure) over the silicon nitride layer 104. Then, using the patterned photoresist layer as a mask, the silicon nitride layer 104 is etched to form a silicon nitride layer 104a. Thereafter, using the silicon nitride layer 104a as a hard mask, the pad oxide layer 102 and the silicon substrate 100 are etched sequentially to form a pad oxide layer 102a and a trench 106 in the substrate 100. Hence, active regions 120 for laying the devices are patterned out. Finally, the photoresist layer is removed.

Next, as shown in FIG. 1C, a thermal oxidation method is used to form a liner layer 108 on the exposed surface inside the trench 106. The liner layer 108 extends all the way from the bottom of the trench 106 to the upper corner regions 130 and touches the pad oxide layer 102a. In the subsequent step, silicon oxide material is deposited into the trench 106 by performing an atmospheric pressure chemical vapor deposition (APCVD) operation. The silicon oxide layer is then densified by heating to a high temperature, thereby forming an insulation layer 110.

Next, as shown in FIG. 1D, using the silicon nitride layer 104a as a polishing stop layer, a chemical-mechanical polishing (CMP) operation is carried out to remove a portion of the insulation layer 110. Finally, an insulation layer 110a is formed inside the trench 106.

Next, as shown in FIG. 1E, hot phosphoric acid ($H_3PO_4$) solution is used to remove the silicon nitride layer 104a, and then hydrofluoric acid (HF) solution is used to remove the pad oxide layer 102a. Finally, an insulation layer 110b, also known as an STI region, is formed inside the substrate 100.

Next, as shown in FIG. 1F, a MOS transistor is formed over the substrate 100. The MOS transistor includes a gate oxide layer 142, a gate electrode 140 and source/drain regions 138. Since the MOS transistor is formed by a conventional method, detailed description of the processing steps are omitted. However, for this type of STI and MOS transistor structure, a large contacting area is normally generated at the junction between the source/drain region 138 (for example, an N-type region) and the substrate 100 (for example, a P-type region). Hence, a large junction capacitance is created there. The larger the junction capacitance, the longer will be the time delay in reaching a stable state. Since a MOS device should not operate until a stable state is reached, operating speed of the device will be lowered.

In light of the foregoing, there is a need to improve the method of forming STI structure.

SUMMARY OF THE INVENTION

Accordingly, the purpose of present invention is to provide a method for manufacturing shallow trench isolation (STI) structure that is capable of reducing junction capacitance between source/drain region and substrate without affecting the overall device layout. Hence, operating speed of the device is increased.

In a second aspect, the purpose of the invention is to provide a method for manufacturing a shallow trench isolation (STI) structure that can increase the degree of electrical insulation between devices in different active regions without affecting the overall device layout.

To achieve these and other advantages and in accordance with the purpose of the invention, as embodied and broadly described herein, the invention provides a method for manufacturing shallow trench isolation (STI) structure. The method includes a two-stage etching operation to form the trench. A trench pattern is transferred to a mask layer by etching, and then an anisotropic etching operation is conducted using the patterned mask as an etching mask to form a first trench in the substrate. Spacers are formed on the sidewalls of the first trench. Using the first trench and the sidewall spacers as a hard mask, an isotropic etching operation is carried out to form a second trench underneath the first trench. Hence, a portion of the second trench is able to extend into the substrate below the device area. A liner layer is formed over the exposed substrate surface of the second trench. Insulating material is deposited to fill the first trench and the second trench.

According to one preferred embodiment of this invention, the first trench has a depth of between 500 Å and 3000 Å and the second trench has a depth of between 500 Å and 5000 Å.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
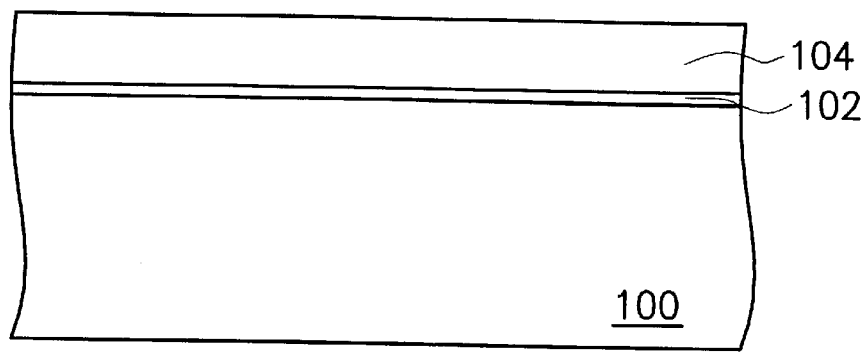
FIGS. 1A through 1F are schematic, cross-sectional views showing the progression of manufacturing steps according to a conventional method of forming a shallow trench isolation structure.
Figure 1B:
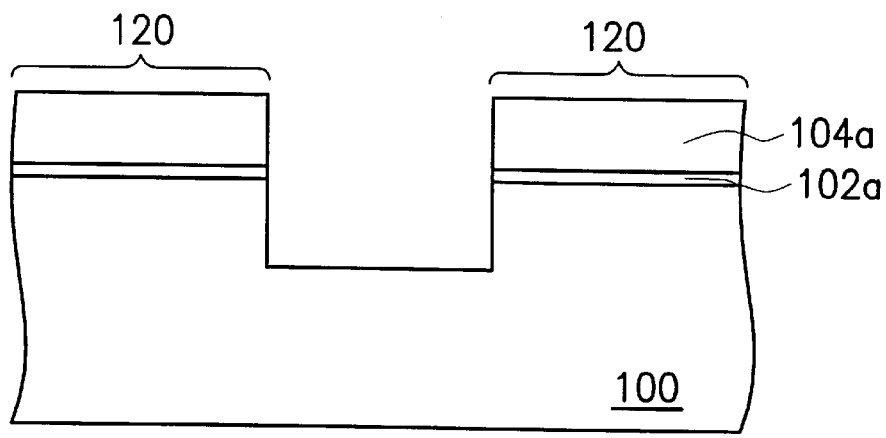
Figure 1C:
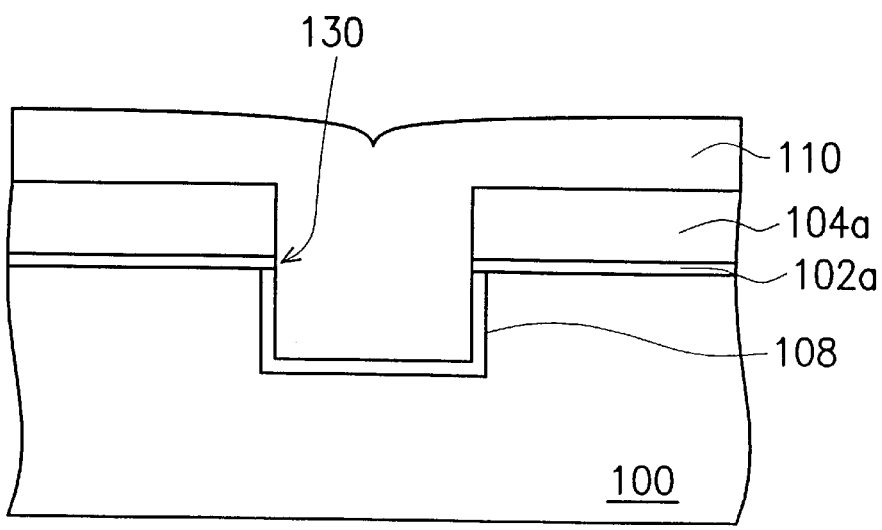
Figure 1D:
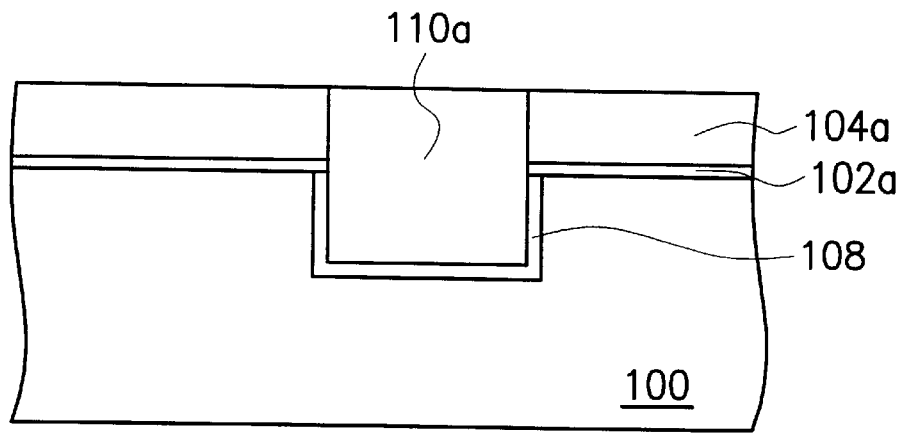
Figure 1E:
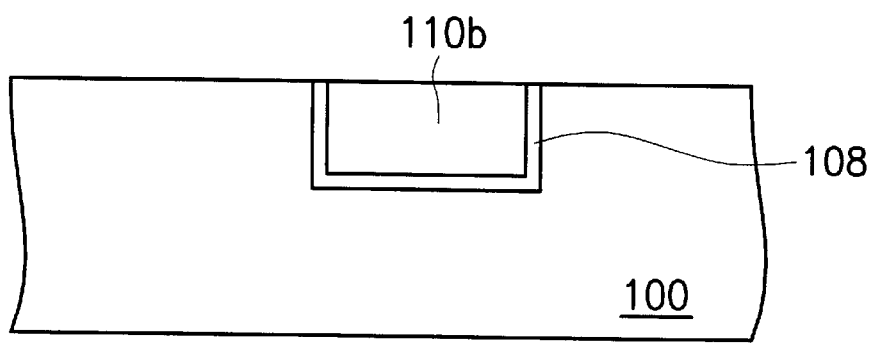
Figure 1F:
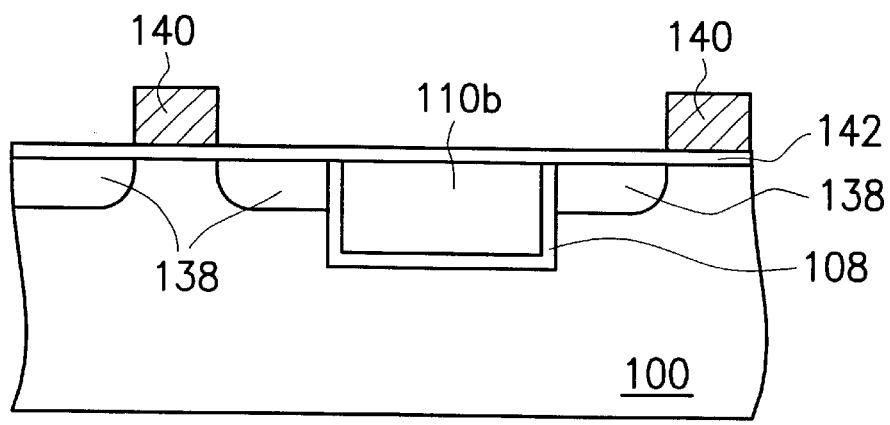

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing the progression of manufacturing steps for forming a shallow trench isolation structure according to one preferred embodiment of this invention.

Figure 2A:
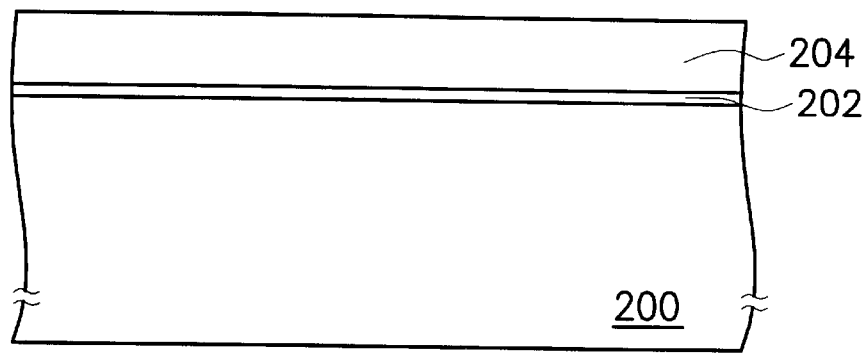
FIGS. 2A through 2F are schematic, cross-sectional views showing the progression of manufacturing steps for forming a shallow trench isolation structure according to one preferred embodiment of this invention.

As shown in FIG. 2A, a substrate 200, preferably a P-type silicon substrate, is provided. A pad oxide layer 202 is formed over the substrate 200. The function of the pad oxide layer 202 is to protect the substrate 200 against unwanted damages during subsequent processing operations. The pad oxide layer 202 having a thickness of about 50 Å to 500 Å can be formed by performing thermal oxidation. A mask layer 204, preferably a silicon nitride layer having a thickness of about 200 Å to 2000 Å is formed over the pad oxide layer 202.

Figure 2B:
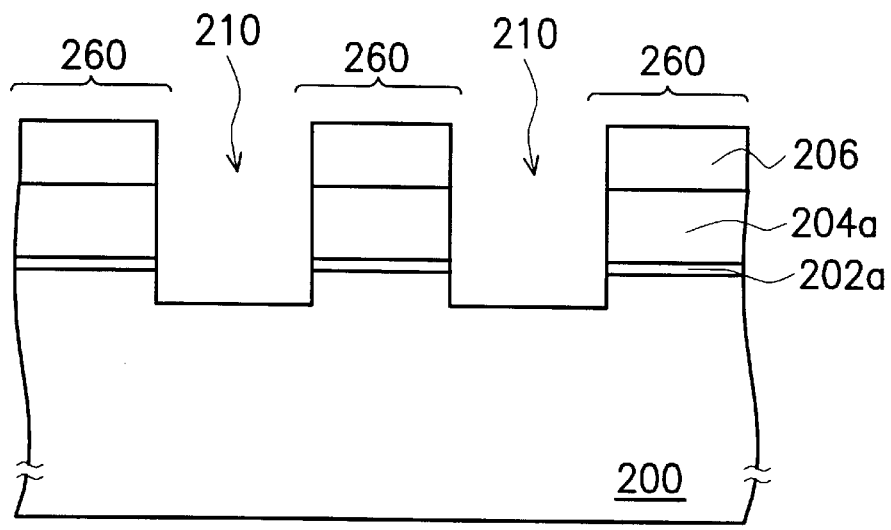

As shown in FIG. 2B, a patterned photoresist layer 206 is formed over the mask layer 204, and then the mask layer 204 is etched to form a mask layer 204a. Using the mask layer 204a as a hard mask, the pad oxide layer 202 and the substrate 200 are sequentially etched by performing an anisotropic etching operation. Active regions 260 are defined in the substrate 200, and pad oxide layers 202a together with trenches 210 each having a depth 215 of between 500 Å and 3000 Å are formed.

Figure 2C:
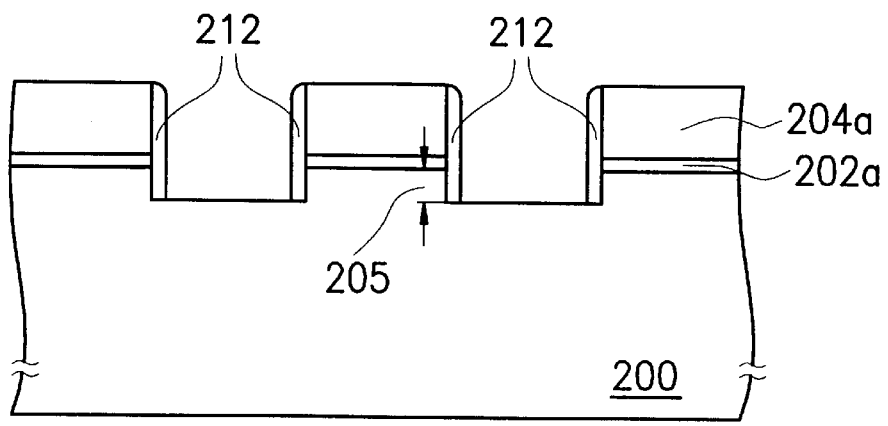
Figure 2D:
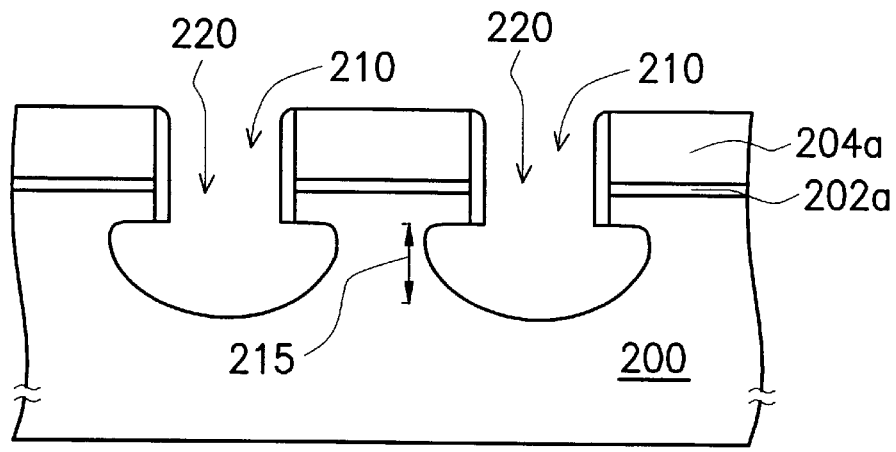

As shown in FIG. 2C, conventional method is used to remove the photoresist layer 206. Spacers 212 are formed on the sidewalls of the mask layer 204a, the pad oxide layer 202a and the trench 210. The spacers 212 can be an oxide layer formed by depositing a conformal oxide layer over the entire substrate structure, and then carrying out an anisotropic etching operation to etch back some of the oxide material.

As shown in FIG. 2D, again using the mask layer 204a and spacers 212 as a hard mask, an isotropic etching operation is conducted to form a second trench 220 in the substrate 200 under the first trench 210. The second trench 220 formed by the isotropic etching operation is bigger than the first trench 210, which is formed by the anisotropic etching operation. A portion of the second trench extends into the substrate 200 in the active region 260. Since the device will only occupy a region of the substrate no deeper than the depth 205, the extension of the second trench 220 into the active region 260 will not affect the layout of the device.

Figure 2E:
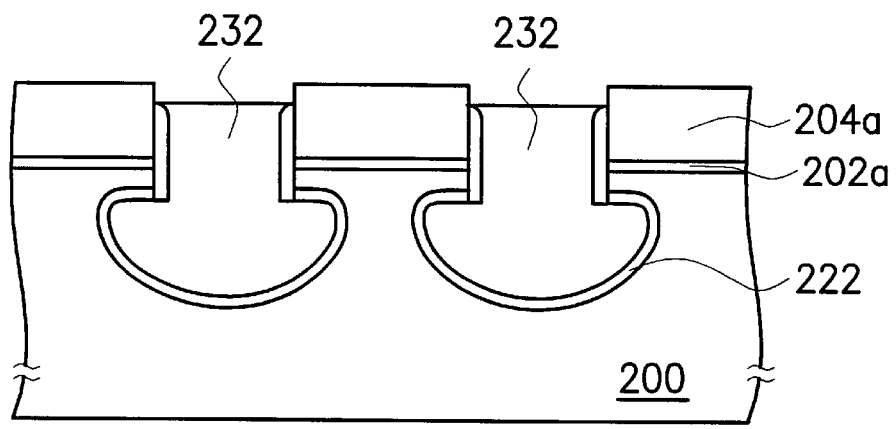

As shown in FIG. 2E, a liner layer 222 is formed on the exposed surface of the second trench 220 by a thermal oxidation method. The liner layer 222 extends from the bottom to the top of the second trench 220 touching the lower part of the spacers 212. Insulating material is deposited into the trenches 210 and 220 and over the mask layer 204a. The insulating layer, for example, can be a silicon oxide layer formed by performing a chemical vapor deposition (CVD) operation. Using the mask layer 204a as a polishing stop layer, a chemical-mechanical polishing (CMP) operation is conducted to remove the top portion of the insulation layer to form an insulation layer 232.

Figure 2F:
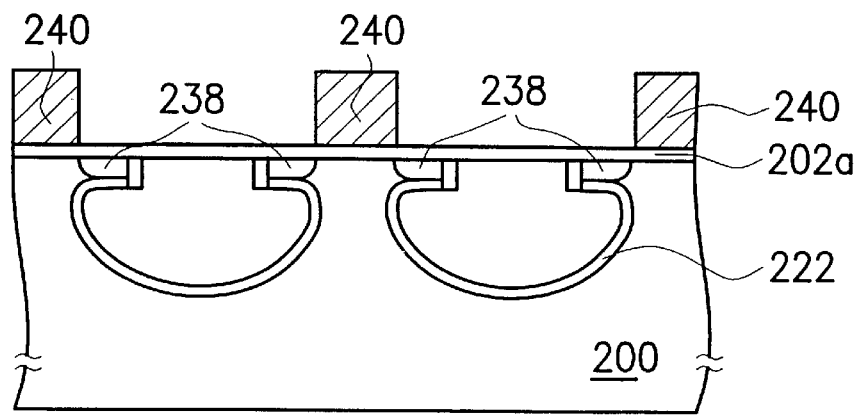

As shown in FIG. 2F, the mask layer 204a and the pad oxide layer 202a are removed to expose the substrate 200 surface. Both the mask layer 204a and the pad oxide layer 202a are removed, preferably using a wet etching method. The pad oxide layer 202a can be removed with hydrofluoric (HF) acid solution as the etchant. A portion of the insulation layer 232 is also removed when the pad oxide layer 202a is etched. Insulation layers 232a, also referred to as shallow trench isolation (STI) structures, are formed. Therefore, portions of the insulation layers 232a extend into the substrate 200 in the active region 260. The portions of the insulation layers 232a extending into the substate 200 in the active region 260 are like as the isolation structures of silicon on insulator (SOI).

MOS transistors are formed over the substrate 200 that has STI structures therein. Each MOS transistor comprises a gate oxide layer 242, a gate electrode 240 and source/drain regions 238. Since the MOS transistors are formed by a conventional method, detail description of the processing steps are omitted here. As shown in FIG. 2F, a portion of the source/drain region 238 is located directly above the insulation layer 232a within the second trench 220, and the electric isolation result thereof is as like as that of using the isolation structure of SOI. Hence, the degree of electrical insulation between MOS transistors in neighboring active regions 260 is increased. The latch-up in the substrate 200 is also reduced. On the other hand, not only the advantage of latch-up in SOI structure exists in the present invention, but also the disadvantage of floating substrate in SOI structure is avoided in the present invention. Moreover, junction capacitance between the source/drain region 238 (such as an N-type region) and the substrate 200 (such as a P-type region) can be greatly reduced. Therefore, the operating speed of the device can be increased. In addition, the STI structure of this invention can be equally applied to formation of a source/drain region having a lightly doped drain (LDD) structure, a moderately doped drain (MDD) structure or a heavily doped drain (HDD) structure.

In summary, this invention includes the usage of a two-stage operation to form a trench. An anisotropic etching operation is conducted to form a smaller trench, and then an isotropic etching operation is conducted to form a wider trench underneath. Hence, a portion of trench extends into the substrate under the device-forming regions. Insulating material is deposit to fill the trench. Therefore, the degree of electrical insulation between devices in neighboring active regions is increased without affecting the layout of device on the substrate. Moreover, the degree of overlap between the source/drain region and the substrate is reduced. Hence, junction capacitance is lowered and the operating speed of the device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing shallow trench isolation (STI) structure, comprising the steps of:

providing a substrate;

forming a patterned mask layer over the substrate to expose a part of the substrate;

forming a first trench by removing the exposed part of substrate;

forming a spacer along a sidewall of the first trench;

forming a second trench underneath the first trench, the second trench exposing a second part of the substrate;

forming a liner layer along a surface profile of the second trench;

filling the first trench and the second trench with an insulating material;

removing the mask layer;

after removing the mask layer, forming a gate oxide layer on the substrate;

forming a gate electrode on the gate oxide layer; and forming a source/drain region in the substrate, wherein the source/drain region is located directly above and adjacent to the second trench.

2. The method of claim 1, comprising further a step of growing a pad oxide layer before forming the patterned mask layer over the substrate.

3. The method of claim 1, wherein the first trench is formed by removing the exposed substrate using an anisotropic etching process.

4. The method of claim 1, wherein the first trench has a depth of about 500 Å to 3000 Å.

5. The method of claim 1, wherein the step of forming the spacers includes growing a silicon oxide layer.

6. The method of claim 1, wherein the second trench has a depth of about 500 Å to 5000 Å.

7. A method for forming a trench structure used for manufacturing a shallow trench isolation (STI) structure in a substrate, comprising:

forming a mask layer on the substrate, the mask layer exposing a part of the substrate;

forming spacers along a sidewall of the first trench;

performing isotropic etching to the first trench with the spacer as a mask, so that a second trench is formed under the first trench, the second trench exposing a part of the substrate;

forming a liner layer over the exposed substrate in the second trench;

filling the first trench and the second trench with an insulating material after filling the first trench and the second trench, removing the mask layer;

forming a gate oxide layer on the substrate;

forming a gate electrode on the gate oxide layer; and forming a source/drain region in the substrate, wherein the source/drain region is located directly above and adjacent to the second trench.

8. The method of claim 7, wherein the first trench has a depth of about 500 Å to 3000 Å.

9. The method of claim 7, wherein the step of forming the spacers includes growing a silicon oxide layer.

10. The method of claim 7, wherein the second trench has a depth of about 500 Å and 5000 Å.

* * * * *